United States Patent
Mantl et al.

(10) Patent No.: US 6,464,780 B1
(45) Date of Patent: Oct. 15, 2002

(54) METHOD FOR THE PRODUCTION OF A MONOCRYSTALLINE LAYER ON A SUBSTRATE WITH A NON-ADAPTED LATTICE AND COMPONENT CONTAINING ONE OR SEVERAL SUCH LAYERS

(75) Inventors: Siegfried Mantl, Jülich; Bernhard Holländer; Ralf Liedtke, both of Bergisch-Gladbach, all of (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 09/600,802
(22) PCT Filed: Jan. 27, 1999
(86) PCT No.: PCT/DE99/00203
§ 371 (c)(1),
(2), (4) Date: Aug. 29, 2000
(87) PCT Pub. No.: WO99/38201
PCT Pub. Date: Jul. 29, 1999

(30) Foreign Application Priority Data

Jan. 27, 1998 (DE) ............................ 198 02 977

(51) Int. Cl.$^7$ ................................ C30B 25/18
(52) U.S. Cl. .................. 117/90; 117/94; 117/101; 438/167; 438/767
(58) Field of Search ............... 117/90, 94, 101; 438/766, 767

(56) References Cited

U.S. PATENT DOCUMENTS

| 4,819,037 | A |   | 4/1989 | Sakakibara et al. |
| 5,084,411 | A |   | 1/1992 | Laderman et al. |
| 5,633,174 | A | * | 5/1997 | Li ............................ 438/475 |
| 5,726,440 | A | * | 3/1998 | Kalkhoran et al. ...... 250/214.1 |
| 5,735,949 | A |   | 4/1998 | Mantl et al. |
| 5,920,764 | A | * | 7/1999 | Hanson et al. ................ 438/4 |
| 6,211,095 | B1 | * | 4/2001 | Chen et al. ................ 438/766 |

FOREIGN PATENT DOCUMENTS

| DE | 248 224 A1 | 7/1987 |
| DE | 37 43 734 A1 | 7/1989 |
| EP | 0 475 378 A1 | 3/1992 |

OTHER PUBLICATIONS

"Ehaviour of Radiation Defects . . . " Suprun–Belevich et al. Nuclear Instruments & Methods . . . B 127/128 (1997).
"Enhanced Strain Relaxation . . . " by Hollander et al. Nuclear Instruments & Methods . . . B 148 (1999).
Thin Solid Films 194 (1997) 3–10 MIT, Cambridge, MA, E.A. Fitzgerald, et al.

* cited by examiner

Primary Examiner—Robert Kunemund
(74) Attorney, Agent, or Firm—Herbert Dubno

(57) ABSTRACT

The invention relates to a method for the production of a monocrystalline layer on a substrate with a non-adapted lattice. To this end, a monocrystalline substrate with a buried amply defective layer and a monocrystalline layer produce thereon are used. The buried amply defective layer can be produced by hydrogen implantation.

10 Claims, 2 Drawing Sheets

METHOD FOR THE PRODUCTION OF A MONOCRYSTALLINE LAYER ON A SUBSTRATE WITH A NON-ADAPTED LATTICE AND COMPONENT CONTAINING ONE OR SEVERAL SUCH LAYERS

CROSS REFERENCE TO RELATED APPLICATIONS

This application is a national stage of PCT/DE99/00203 filed Jan. 27, 1999 and based upon German national application 198 02 977.2 of Jan. 27, 1998 under the International Convention.

FIELD OF THE INVENTION

The invention relates to a method of making a monocrystalline layer on an unmatched-lattice monocrystalline substrate in which the monocrystalline layer is formed especially by deposition on the surface of the substrate. The invention further relates to a component containing one or more such layers.

BACKGROUND OF THE INVENTION

Usually the production of monocrystalline films is strongly limited by the available substrate material or the quality of the film is reduced. Different crystal structures as well as different lattice parameters between substrate and layer material (lattice defect matching) limit as a rule a monocrystalline growth of layers of higher quality. An example which is especially important for microelectronic applications is the formation of silicon-germanium (SiGe) alloys on silicon (Si). When monocrystalline layers are deposited with unmatched-lattice parameters, this has the consequence that these layers initially grow under mechanical stress, i.e. the lattice structures of the layers differ from that of the original. When the deposited layer exceeds a certain degree of stress, the mechanical stress is diminished by defect formation and the lattice structure comes closer to the original. This process is termed stress relaxation and as "relaxation" below.

With layer thicknesses which are usually required for components, this relaxation gives rise to defects at the boundary layer between the layer formed and the substrate whereby, however, many defects can run from the boundary layer to the layer surface (so-called threading dislocations). Since usually these dislocations develop through newly grown layers, they reduce the electrical and optical properties of the layer material significantly.

For modern telecommunications, high-speed inexpensive transistors are required. Previous transistors based on silicon do not have the desired speeds whereas those formed from combination semiconductors (GaAs) can reach these speeds. However, the use of compound semiconductors is not compatible with existing wide ranging Si technology. By the use of high quality relaxation SiGe layers, high speed transistors have been developed which show wide range compatibility with Si technology.

The state of the art in the production of, for example, stress-free qualitatively high value SiGe alloy layers on Si substrates is the use of the so-called "graded layer". In this system SiGe layers are produced with a Ge concentration which increases toward the surface until the desired Ge content is reached. Since to maintain the layer quality an increase of the Ge content of only about 10 atom percent per $\mu$m can be set, such layers depending upon the Ge concentration reached can be two to three micrometers thick. For the layer growth this is not satisfactory from economical or technological points of view. The layer growth of this "graded layer" is described in E. A. Fitzgerald et al., Thin Solid Films, 294 (1997) 3. This process gives rise usually to high layer roughness and incomplete relaxation.

OBJECT OF THE INVENTION

The object of the invention is to provide a method of the type described at the outset as well as a component in which the above-described drawbacks are avoided and especially formation of threading dislocations can be avoided.

SUMMARY OF THE INVENTION

The object is achieved by forming a buried defect-rich layer in the monocrystalline substrate.

It has been found that the layer which then forms on the substrate surface is relaxed and thus that the formation of threading deformations is restricted. It has been found further that in this manner the lattice parameters of the thus formed layer come closer to the original lattice structure than the originally stressed layer such that the quality of the deposited film is not diminished by the incorporation of crystal defects according to the invention. The method of the invention thus, and in an advantageous way, can achieve a surface roughness of the formed layer which is significantly reduced by comparison to conventionally made layers. It can be advantageous to form the buried layer without damaging the surface structure of the substrate as close as possible to this surface.

The formation of the defect-rich layer buried below the substrate surface can be effected by means of ion implantation, e.g. with hydrogen can be used as the implanted ion type.

The method provides for an advantageously dislocation free deposit of the layer formed upon the substrate surface with an implantation dose in the range of $1 \times 10^{14}$ cm$^{-2}$ to $1 \times 10^{17}$ cm$^{-2}$. The ion implantation can be effected selectively either prior to the deposit of the crystalline film or after the deposit of the crystalline film to form the layer.

In an advantageous variant of the method of the invention, the ion type for implantation is selected in accordance with the substrate material for film material which is used. Especially suitable are light ions or noble gas ions.

The method according to the invention is advantageously so carried out that with further implantations the defect structure is optimized especially as to its depth. In this respect the second implantation is advantageous with a second ion type to achieve the defect density or the increase in the gas bubble density. It has been found to be very advantageous for the method of the invention to complete the thermally-induced relaxation and defect reduction by an annealing treatment.

The process according to the invention is not limited to the use of silicon substrates to form a buried defect-rich layer. Rather it can be advantageous to use a substrate material selected from the group consisting of Si, Ge, GeAs, SiC, sapphire and In P.

The component according to the invention, e.g. a blue diode based upon a sapphire substrate with a monocrystalline GaN layer or a transistor, especially a modulator field-effect transistor (ModFET), has the advantage that the microelectronic or optoelectronic characteristics of the component can be optimally configured in the layers formed without the detrimental effects or damage of threading dislocations. On the one hand, the layer fabricated according to the invention can form the desired end product. It is however foreseeable that this layer formed in accordance with the invention can constitute a suitable base, for example a buffer layer, for the growth of a further layer. In this manner, it forms a seed layer for the further growth of a monocrystalline film.

The process of the invention for producing a relaxing monocrystalline layer with limited dislocation density includes in an advantageous manner the production of a buried defect-rich layer in the substrate by hydrogen implantation This light ion type of implantation allows precise defined defect formation within the substrate to the desired depths.

BRIEF DESCRIPTION OF THE DRAWING

The invention is described in greater detail based upon the drawing and examples. In the drawing.

SPECIFIC DESCRIPTION

Figure 1:
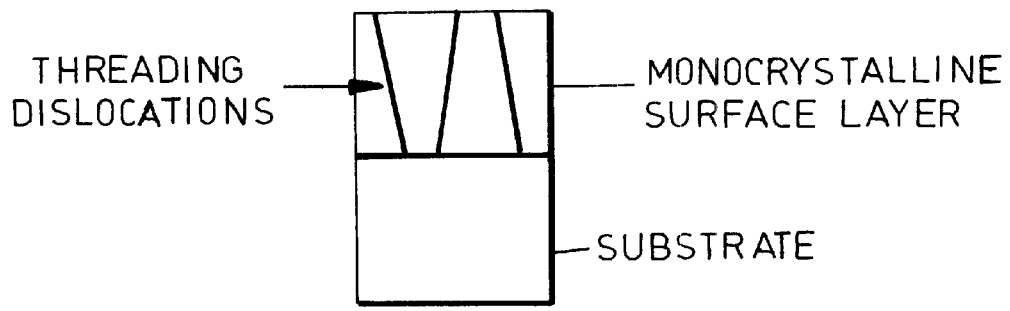
FIG. 1 is a schematic illustration of a layer produced on a nonmatching lattice defect substrate by means of heteroepitaxy by the previous process and with a multiplicity of threading dislocations running through the surface layer.

In the drawing, for clarification of the approach of the method of the invention, a layer formed according to the prior method technique is illustrated schematically by comparison with a layer made according to the process of the invention. In FIG. 1, a layer has been shown which has been fabricated according to the prior process with heteroepitaxy on a substrate which has not been matched with respect to lattice defects, whereby many threading dislocations run through the surface layer.

Figure 2:
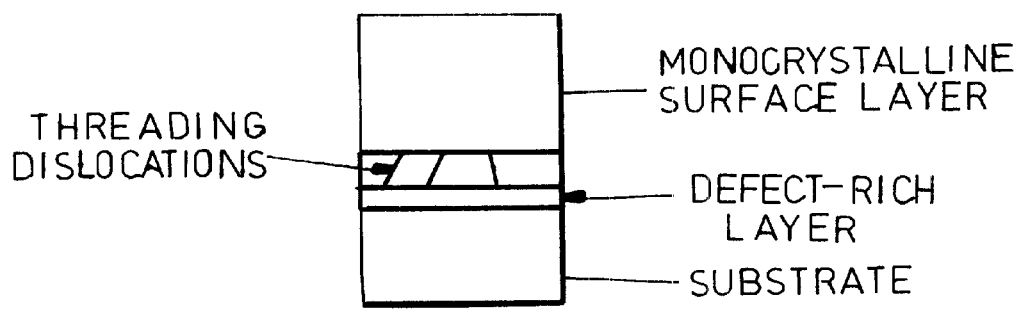
FIG. 2 is a diagrammatic section through a layer fabricated by the method according to the invention with an approximately dislocation-free surface.

In FIG. 2 a layer produced by the process according to the invention has been shown in side view. The here-indicated threading deformations which extend into the substrate need not necessarily result. As can be seen from FIG. 2 it is not possible according to the process known in the state of the art to deposit on the substrate a monocrystalline stress-free surface layer without threading dislocations.

In the components shown in FIG. 2, the monocrystalline substrate, which has a buried defect-rich layer, is so obtained that the threading dislocations run in the defect-rich layer and not through the monocrystalline surface layer (the film).

EXAMPLE 1

Monocrystalline Si—Ge Mixed Crystal on Hydrogen-implanted Si Substrate.

As the substrate, an Si wafer is used. In this substrate, using a commercial implantation apparatus, hydrogen is implanted with a dose of $1 \times 10^{16}$ cm$^{-2}$ and an energy of about 1 KeV so that buried defect layer results proximal to a surface without producing defects in the uppermost atomic layer of the Si substrate. The so produced defect layer is stable to about 700° C., i.e. the defects are scarcely healed up to this temperature. This enables the subsequent deposition of silicon (Si) and germanium (Ge) in a ratio of 80:20 by means of molecular beam epitaxy (MBE) at about 500° C. The thus obtained surface layer remains partly under mechanical stress.

During subsequent tempering, (1100° C., 30 s) the mechanical stress of the surface layer is eliminated, whereby the dislocations run in the buried defect-rich layer in the Si substrate (FIG. 2). The thus fabricated SiGe layer can either be directly used or can serve as an intermediate layer or further epitaxial growth of heterostructures and superlattices.

EXAMPLE 2

Monocrystalline Si-Ge Mixed Crystal on Si and Subsequent Hydrogen Implantation

As the substrate, an Si wafer is used. This commercial substrate is cleaned as is customary in Si epitaxy to obtain a perfect and clean surface. Then at 500° C., Si and Ge in a ratio of 80:20 are deposited by means of molecular-beam epitaxy (MBE). The thus obtained monocrystalline surface layer with a thickness of only 200 mm is under mechanical stress. After the epitaxy, the surface layer is implanted with an implantation apparatus with hydrogen with a dose of $1 \times 10^{16}$ cm$^{-2}$. The implantation energy of the H$^+$ ions is so chosen, e.g. 20 KeV H$^+$ that the buried defect-rich layer arises immediately below the boundary layer of the surface film and the Si substrate. By subsequent tempering (100° C., 30 s) the mechanical stress of the surface layer is eliminated, whereby the dislocations run in the buried defect-rich layer in the Si substrate (FIG. 2). The thus produced SiGe layer can be either directly used or can serve as an intermediate layer or further epitaxial growth of heterostructures and superlattices.

A special feature of the layer produced in accordance with the invention is that it has significantly reduced surface roughness than conventionally produced layers.

Figure 3:
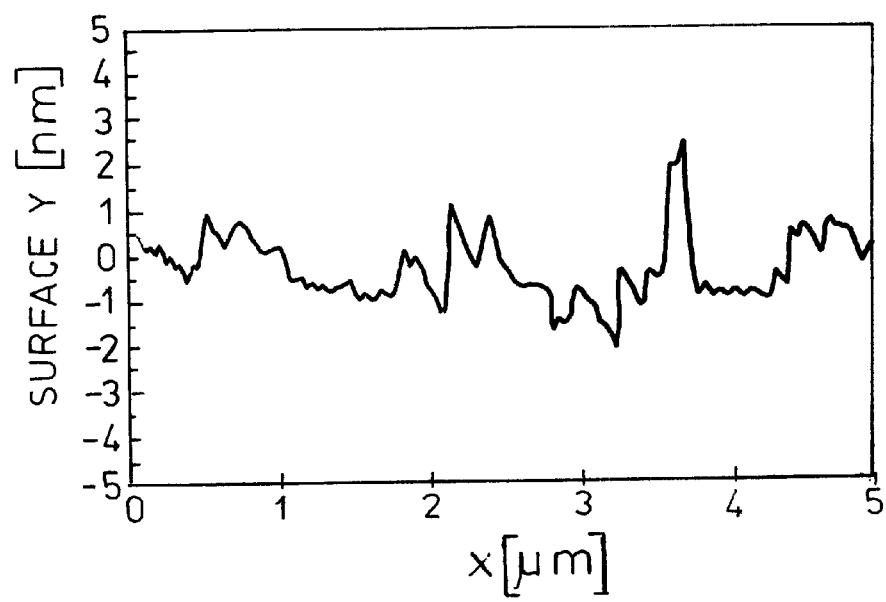
FIG. 3 is a graph of the surface structure of a conventional relaxed Si—Ge layer.
Figure 4:
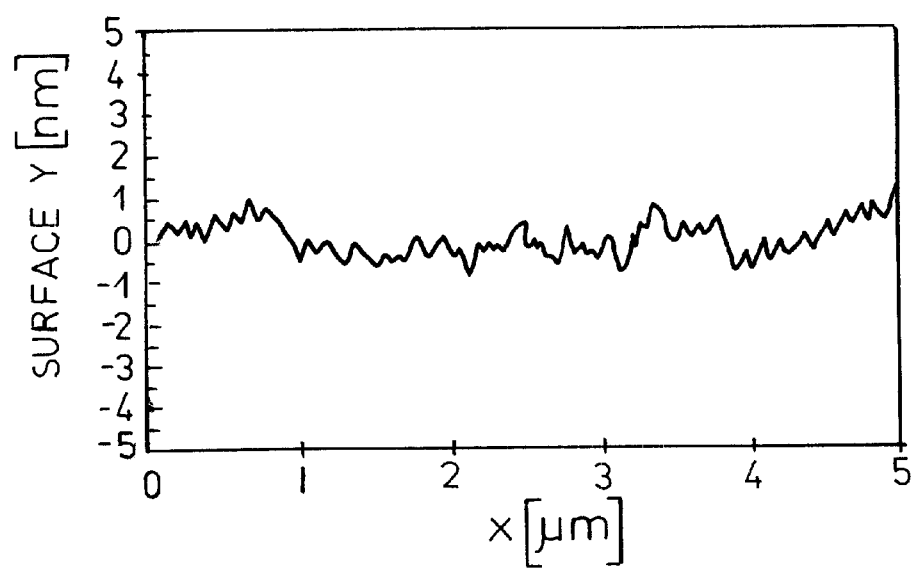
FIG. 4 is a graph of the surface structure of an SiGe layer manufactured according to the invention.

FIG. 3 shows the course of a conventionally-produced layer which has surface irregularities in a range of 1 to 5 nm (nanometers). By contrast, FIG. 4 shows the course of a layer produced in accordance with the invention with a clearly smoother surface without substantial surface steps.

We claim:

1. A method of producing a monocrystalline layer structure, comprising the steps of:
   (a) depositing upon a surface of an unmatched-lattice monocrystalline substrate a monocrystalline layer; and
   (b) controlling defect development in said monocrystalline layer by forming below said surface in said monocrystalline substrate a buried defect-rich layer, thereby substantially preventing development of threading dislocations in said monocrystalline layer said buried defect-rich layer being formed in said monocrystalline substrate as close as possible to said surface without disturbing said surface by ion implantation of hydrogen into said monocrystalline substrate.

2. The method defined in claim 1 wherein the hydrogen implantation is effected with a dose in the range of $1 \times 10^{14}$ cm$^{-2}$ to $1 \times 10^{17}$ cm$^{-2}$.

3. The method defined in claim 2 wherein said buried defect-rich layer is formed in said monocrystalline substrate prior to the application of said monocrystalline layer to said surface.

4. The method defined in claim 2 wherein said buried defect-rich layer is formed in said monocrystalline substrate subsequent to the application of said monocrystalline layer to said surface.

5. The method defined in claim 2, further comprising the step of annealing the substrate during deposition of said monocrystalline layer thereon.

6. The method defined in claim 2, further comprising the step of annealing the substrate with said monocrystalline layer thereon.

7. A method of producing a monocrystalline layer structure, comprising the steps of:
   (a) depositing upon a surface of an unmatched-lattice monocrystalline substrate a monocrystalline layer; and
   (b) controlling defect development in said monocrystalline layer by forming below said surface in said monocrystalline substrate a buried defect-rich layer, thereby substantially preventing development of threading dislocations in said monocrystalline layer said buried defect-rich layer being formed in said monocrystalline substrate as close as possible to said surface without disturbing said surface by ion implantation of light ions or ions of a noble gas into said monocrystalline substrate.

8. A method of producing a monocrystalline layer structure, comprising the steps of:
   (a) depositing upon a surface of an unmatched-lattice monocrystalline substrate a monocrystalline layer; and
   (b) controlling defect development in said monocrystaline layer by forming below said surface in said monocrystalline substrate a buried defect-rich layer, thereby substantially preventing development of threading dislocations in said monocrystalline layer said buried defect-rich layer being formed in said monocrystalline substrate as close as possible to said surface without disturbing said surface by ion implantation into said monocrystalline substrate, and wherein, after a first ion implantation with ions of a first type to produce buried defects in said substrate a second ion implantation is carried out with ions of a second type different from the ions of said first type.

9. The method defined in claim 8 wherein said substrate is selected from the group which consists of Si, Ge, GaAs, SiC, sapphire, and InP.

10. An electrical or optoelectrical component in the form of a blue diode comprising a monocrystalline substrate and a monocrystalline layer on said substrate and made by a method comprising the steps of:
   (a) depositing upon a surface of an unmatched-lattice monocrystalline substrate a monocrystalline layer; and
   (b) controlling defect development in said monocrystalline layer by forming below said surface in said monocrystalline substrate a buried defect-rich layer, thereby substantially preventing development of threading dislocations in said monocrystalline layer, wherein said substrate is sapphire and said monocrystalline layer is GaN.

\* \* \* \* \*